United States Patent [19]

Citta et al.

[11] Patent Number: 4,755,762
[45] Date of Patent: Jul. 5, 1988

[54] COMBINED FPLL AND PSK DATA DETECTOR

[75] Inventors: Richard W. Citta, Oak Park; Gary J. Sgrignoli, Mount Prospect, both of Ill.

[73] Assignee: Zenith Electronics Corporation, Glenview, Ill.

[21] Appl. No.: 25,240

[22] Filed: Mar. 12, 1987

[51] Int. Cl.⁴ .............................................. H04N 9/50
[52] U.S. Cl. ........................................ 329/50; 358/24; 358/195.1; 455/208; 331/12
[58] Field of Search .............. 329/50; 331/12; 358/24, 358/158, 195.1; 455/182, 208, 260, 337

[56] References Cited

U.S. PATENT DOCUMENTS 4,072,909  2/1978  Citta ........................................ 331/12
4,091,410  5/1978  Citta ........................................ 329/50

Primary Examiner—Eugene R. LaRoche
Assistant Examiner—Robert J. Pascal

[57] ABSTRACT

An FPLL circuit has a first low pass filter and a limiter having a delay that is less than one half the duration of a data bit for developing binary PSK data and a pair of multipliers, a first of which is operated in phase with and the other of which is operated in phase quadrature with an incoming RF signal. The second multiplier is connected to a third multiplier, which is also supplied with the limiter output for stabilizing the loop in the presence of data. The output of the third multiplier is supplied to a low pass filter that has a delay that is greater than the duration of a data bit and this output supplies an oscillator that develops the 90° phase displaced signals for the first two multipliers.

5 Claims, 3 Drawing Sheets

COMBINED FPLL AND PSK DATA DETECTOR

BACKGROUND OF THE INVENTION AND PRIOR ART

This invention relates generally to PSK data detectors and particularly PSK data detectors utilized in television signal scrambling systems.

Phase locked loops (PLL) are well-known in the art. When such loops are utilized with phase shift keyed (PSK) binary data systems, they suffer an inherent drawback in that there is an unstable lock condition. One well-known system for detecting binary PSK data is known as a Costas loop, which in essence, comprises a pair of multipliers that are driven by an oscillator, with one multiplier driven in phase and the other driven in phase quadrature with respect to an incoming RF signal. Both multiplier outputs are supplied, through matched low pass filters to a third multiplier, that is used to make it bi-phase stable. The detected binary PSK data is taken from the in-phase input to the third multiplier. The output of the third multiplier is supplied through another low pass filter to the voltage controlled oscillator (VCO). The circuit is bi-phase stable with the third multiplier functioning to maintain the loop locked despite the carrier phase alterations due to the data. The Costas loop suffers the limitation of all PLL systems in terms of its very slow acquisition time. The Costas loop also suffers from a restricted frequency pull-in range.

U.S. Pat. No. 4,072,909 entitled AUTOMATIC PHASE AND FREQUENCY CONTROL SYSTEM issued Feb. 7, 1978 to R. Citta describes a loop that uses both phase and frequency locking. It is called an FPLL, and has the characteristics of both wide and rapid frequency acquisition and the desirable aspects of a phase locked loop system. It also is bi-phase stable. That arrangement utilized a third multiplier which is directly supplied from one of the phase quadrature multipliers, but supplied through a low pass filter and limiter (in a phase delay arrangement) from the other multiplier. The output of the third multiplier is supplied, through a low pass filter, to the input of the VCO. That system is characterized by a wide frequency acquisition range (even with very narrow PLL bandwidths). U.S. Pat. No. 4,091,410 entitled FREQUENCY AND PHASE LOCK LOOP SYNCHRONOUS DETECTING SYSTEM HAVING A PAIR OF PHASE LOCK CONDITIONS issued May 23, 1978 to R. Citta describes an FPLL circuit as above mentioned used as a video detector in a television receiver. In that circuit, the phase ambiguity of the FPLL arrangement presented a serious problem that had to be overcome by special circuitry to assure that the video signal always had the same polarity. The arrangement used the output of the limiter, which is phase indicative of the input RF signal, to develop a phase inverting signal for maintaining a constant phase of video output signal.

The present invention retains the frequency acquisition range and phase locked stability of the FPLL of the above patents in addition to providing reliable binary PSK data detection. The novel arrangement presents an extremely attractive solution for low cost, high reliability television signal descrambling systems in which the video signal is scrambled by suppressing the horizontal syncs and inverting the phase of the carrier and data is transmitted by modulating the widths of the horizontal intervals. The wide frequency acquisition range and phase locked stability of the system of the invention obviates the need for precision crystal control of frequency and makes possible an economical, high reliability decoder for use in a CATV system. This is achieved in the FPLL of the invention by suitably tailoring the low pass filter bandwidths with respect to the data rate, that is the reciprocal of the time required to transmit each bit of information.

OBJECTS OF THE INVENTION

A principal object of the invention is to provide a novel FPLL circuit.

A further object of the invention is to provide an FPLL arrangement that provides reliable PSK data detection.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figure 1:
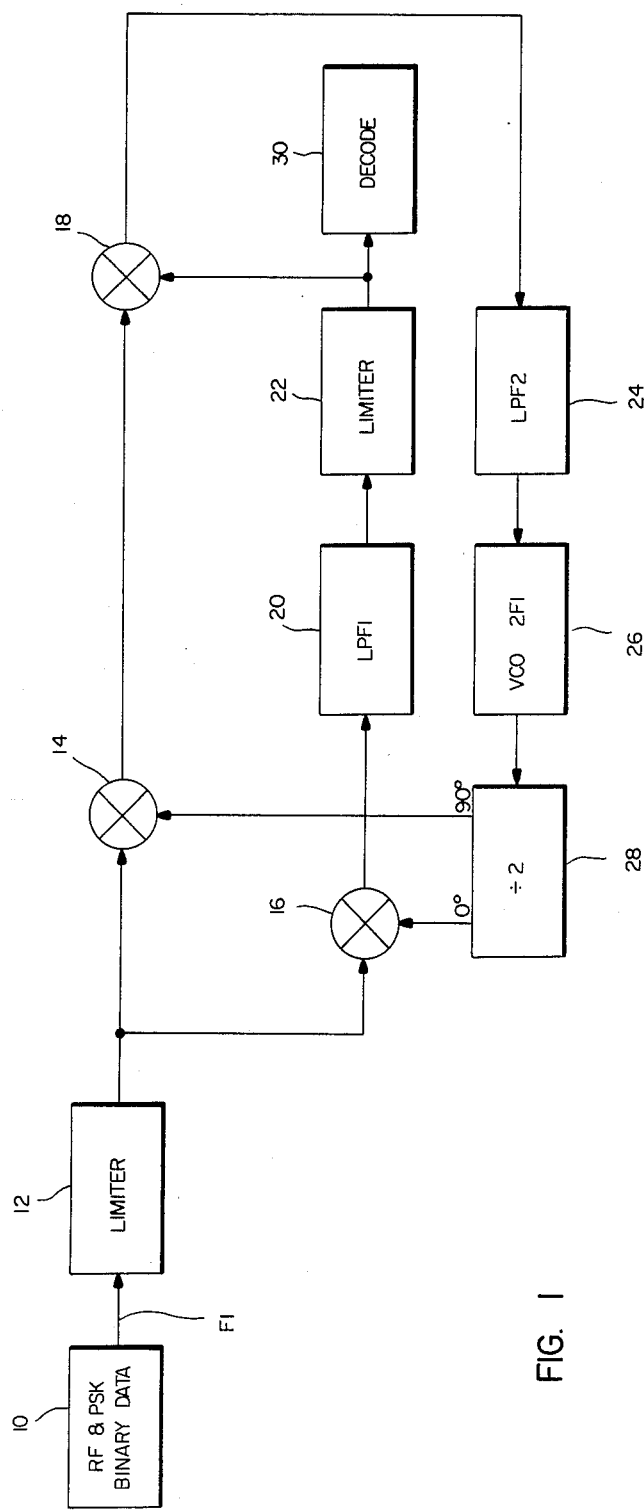
FIG. 1 is a block diagram of the FPLL of the invention.

Referring to FIG. 1, an input signal source 10 consisting of an RF signal that is encoded with binary PSK data supplies an RF signal having a carrier frequency F1 to a limiter 12, the output of which is supplied to a pair of multipliers 14 and 16. The output of multiplier 14 is connected to one input of a multiplier 18 and the output of multiplier 16 is connected to a first low pass filter 20 that is, in turn, connected to a limiter 22. The output of limiter 22 is connected to the other input of multiplier 18 and also to a decode means 30. The output of multiplier 18 is connected to a second low pass filter 24 that, in turn, is connected to a voltage controlled oscillator (VCO) 26 having a nominal frequency of 2F1 that is equal to twice the input signal frequency. The output of VCO 26 is supplied to a divide-by-two circuit 28 which produces two outputs in phase quadrature. The 0° output is supplied to multiplier 16 and the 90° output is supplied to multiplier 14. The basic FPLL circuit operates substantially the same as those in the above-mentioned patents. However, the delays introduced by the bandwidths of filter 20 and filter 24 are tailored with respect to the data rate of the PSK data to assure that the loop always remains locked and that the data is reliably detected. As is well-known, the data rate is determined by a series of pulses depicting ones and zeros and may be represented by a square wave having a period of 2T, where T equals the duration of one data bit. In accordance with the invention, the bandwidths are such that the delay introduced by filter 20 must be less than T/2 and is preferably in the range of T/5. The other criterion is that the bandwidth of LPF 24 must introduce a delay that is greater than T to prevent the loop from unlocking during a phase change. The output of limiter 22 causes multiplier 18 to correct for the polarity reversal caused by the data therefore producing a stable lock state. The important point to note is that to use the FPLL as a reliable data detector, the loop must not be allowed to unlock during data reception.

Figure 2:
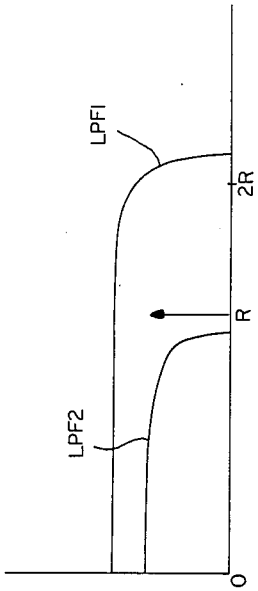
FIG. 2 is a set of bandwidth curves for the low pass filters of the inventive FPLL.

FIG. 2 shows the bandwidth characteristics of the low pass filters LPF1 and LPF2 that are required for the FPLL of the invention to operate as a PSK data detector. In the figure, the data rate is indicated by R, which is equal to 1/T. The bandwidth relationship is defined as $$\frac{BW(LPF1)}{2} > R > BW(LPF2)$$

FIG. 2 clearly illustrates this relationship.

Figure 3:
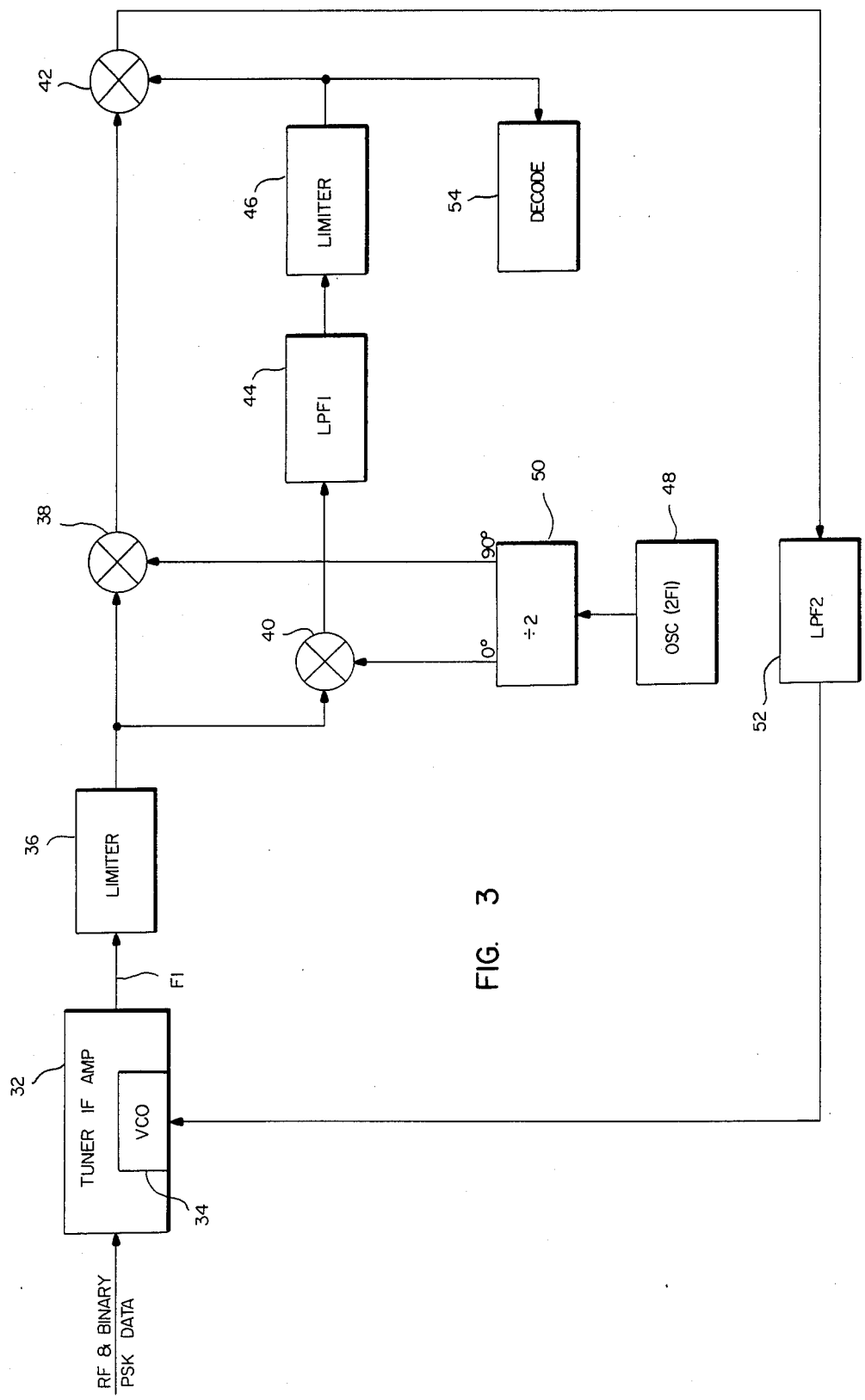
FIG. 3 is a so-called "long loop" version of the FPLL of the invention.

The arrangement of FIG. 1 is a "short loop" as that term is used in U.S. Pat. No. 4,091,410 above. The arrangement of FIG. 3 is considered a "long loop." In the long loop arrangement, the oscillator in the FPLL circuit is fixed in frequency, with the control signal output of the loop adjusting frequency of the incoming signal rather than the oscillator frequency. Thus, a tuner/IF amplifier arrangement 32 is shown as receiving the RF signal with the binary PSK data. A VCO 34 is indicated within tuner IF 32. The output signal from tuner IF 32 has a frequency F1 and is supplied to a limiter 36 before being coupled to the two multipliers 38 and 40 of the FPLL loop. The output of multiplier 38 is connected to a multiplier 42, the other input of which is connected to multiplier 40 through the series connection of a first low pass filter 44 and a limiter 46. The output of limiter 46 is also connected to decode means 54 and provides the detected PSK data. The third multiplier 42 supplies a second low pass filter 52 that in turn is connected back to control VCO 34 in tuner IF 32. A fixed oscillator 48, having a nominal frequency equal to 2F supplies a divide-by-two counter 50 that provides quadrature phase-related voltages to multipliers 38 and 40. The circuit operation is substantially the same for FIG. 1 with the difference being that VCO 34 is controlled to maintain F1 locked in phase and frequency with the frequency of oscillator 48.

Figure 4:
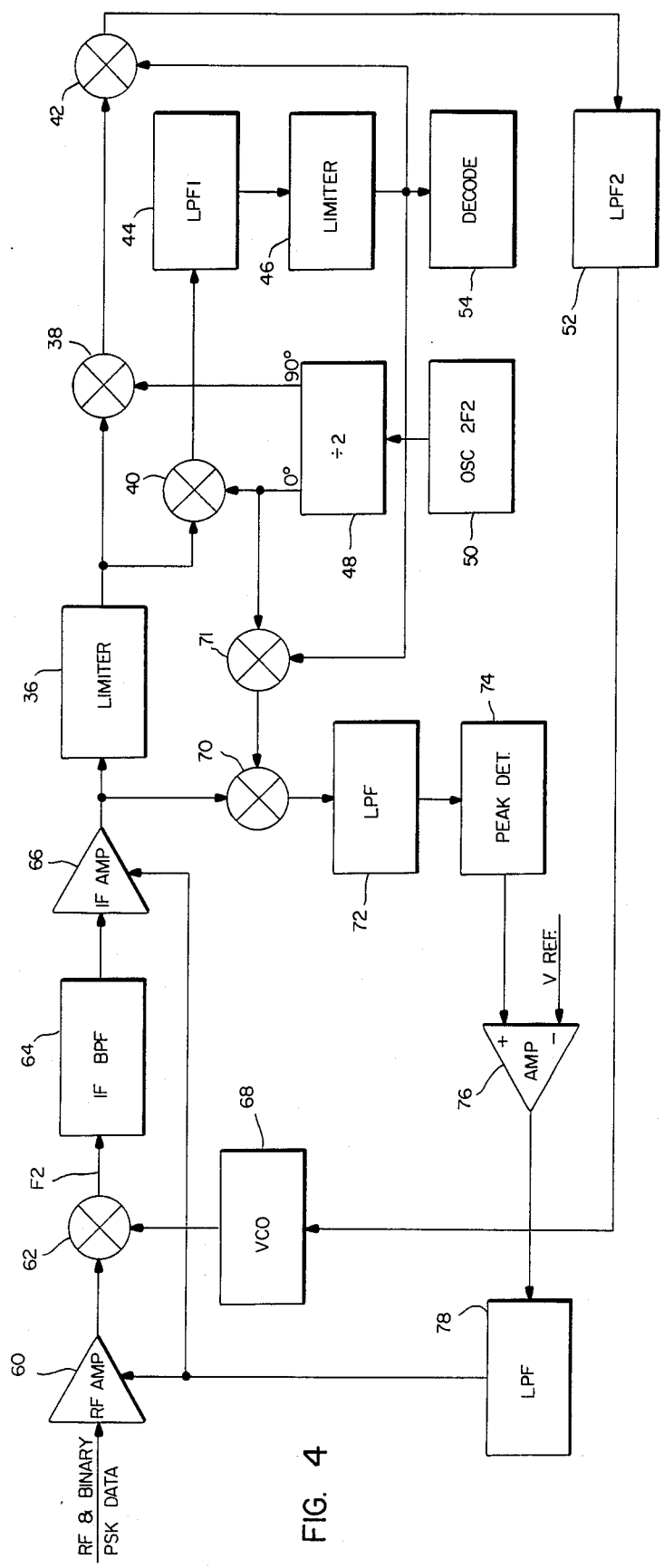
FIG. 4 is a block diagram of the "long loop" FPLL of the invention in conjunction with an automatic gain control (AGC) circuit.

In FIG. 4, the "long loop" arrangement of the FPLL of FIG. 3 is shown in conjunction with an AGC system for controlling the gain of the tuner and IF amplifier. An RF amplifier 60 is supplied with the input RF signal having binary PSK modulation and in turn supplies a multiplier 62 (functioning as a mixer), the output of which is supplied to an IF bandpass filter 64. The bandpass filter output is coupled to an IF amplifier 66. A VCO 68 is coupled to multiplier 62 and, in a conventional manner, the RF signals amplified by amplifier 60 are heterodyned with the output of VCO 68 in multiplier 62 to produce an intermediate frequency F1. The output of IF amplifier 66 is supplied to the FPLL which, as indicated, is substantially identical to that illustrated in FIG. 3, like parts being indicated by like reference characters. The difference is that the output of IF amplifier 66 is also supplied to a multiplier 70. The other input of multiplier 70 is supplied with the output of a multiplier 71 that is fed with the 0° output signal from divide-by-two counter 48. In this arrangement, multiplier 70 functions as a synchronous detector for detecting the video modulation in the RF television signal. The output of multiplier 70 is supplied through a low pass filter 72 to a peak detector 74 where the peak amplitude of the detected video signal is detected. The output of peak detector 74 is supplied to one input of a differential amplifier 76, the other input of which is connected to a DC voltage reference source. In accordance with the deviation between the peak detector output voltage and the voltage reference source, an output signal is developed by amplifier 76, is passed through a low pass filter 78 and used to control the gain characteristics of RF amplifier 60 and/or IF amplifier 66. It will be appreciated that these gain control circuits (not shown) are well-known in the art. The arrangement of the FPLL circuit of the invention in FIG. 4 is thus seen to provide a very attractive FPLL and an AGC circuit for a scrambled television signal that is modulated with binary PSK data.

It is recognized that numerous modifications and changes in the described embodiment of the invention will be apparent to those skilled in the art without departing from its true spirit and scope. The invention is to be limited only as defined in the claims.

What is claimed is:

1. In combination with an RF signal modulated with binary PSK data having a data rate:
   bi-phase stable loop means having a frequency aquisition mode and a phase locking mode for sequentially frequency tracking and phase locking to said RF signal;
   delay means in said loop means for enabling changes between the two stable phases of the loop means to be made fast enough to prevent loss of phase lock in said loop means and slow enough to enable reliable detection of said PSK binary data at said data rate.

2. In a data transmission system wherein phase reversals of an RF carrier convey binary data to loop means comprising:
   an input for receiving said RF carrier;
   first and second multiplying means coupled to said input;
   oscillator means driving said first and second multiplying means to demodulate said RF carrier;
   third multiplying means directly coupled to said first multiplying means;
   a first low pass filter and a limiter serially connected between said second multiplier means and said third multiplier means;
   a second low pass filter connected between the output of said third multiplier means and the input of said oscillator means; and
   the period of one bit of said data being greater than twice the delay introduced by said first low pass filter and less than the delay introduced by said second low pass filter whereby said binary data is recoverable in the output of said limiter.

3. In combination:
   an RF signal modulated with PSK binary data;
   loop means having an input terminal for receiving said RF signal and an output filter for developing a control voltage for sequentially frequency tracking and phase locking said loop means to said RF frequency;
   oscillator means and a pair of multipliers driven therefrom in said loop means;
   third multiplier means directly coupled to one of said pair of multipliers and supplying said low pass filter;
   a low pass filter and a limiter serially connected between the other of said pair of multipliers and said third multiplier means; and decoder means coupled to the output of said limiter for decoding said binary data, the delay introduced by said low pass filter being less than one-half the duration of one data bit in said binary data and the delay introduced by said output filter being greater than the duration of one data bit in said binary data.

4. The combination of claim 3 wherein said oscillator means has a nominal frequency equal to twice that of said RF signal and is coupled to said output filter; and further including a divide-by-two circuit coupled between said oscillator means and said pair of multipliers.

5. The combination of claim 4, further including tuner means for receiving said RF signal and frequency down converting it before application to said input terminal;
 said tuner means including a variable frequency oscillator; and
 means coupling said output low pass filter to said variable oscillator.

* * * * *